US008935586B2

(12) United States Patent
Chickanosky et al.

(10) Patent No.: US 8,935,586 B2
(45) Date of Patent: Jan. 13, 2015

(54) STAGGERED START OF BIST CONTROLLERS AND BIST ENGINES

(71) Applicant: International Business Machines Corporation, Armonk, NY (US)

(72) Inventors: Valarie H. Chickanosky, South Burlington, VT (US); Kevin W. Gorman, Fairfax, VT (US); Suzanne Granato, Essex Junction, VT (US); Michael R. Ouellette, Westford, VT (US); Nancy H. Pratt, Essex Junction, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 13/671,605

(22) Filed: Nov. 8, 2012

(65) Prior Publication Data

US 2014/0129888 A1 May 8, 2014

(51) Int. Cl.
*G01R 31/28* (2006.01)
(52) U.S. Cl.
USPC ............... 714/733; 714/30; 324/73.1; 377/19
(58) Field of Classification Search
CPC .... G01R 31/3187; G01R 31/28; G11C 29/16; G11C 29/44; G06F 11/27
USPC ........................ 714/733, 30; 324/73.1; 377/19
See application file for complete search history.

(56) References Cited

U.S. PATENT DOCUMENTS

| 6,137,734 | A | 10/2000 | Schoner et al. |
| 6,255,836 | B1 * | 7/2001 | Schwarz et al. ............ 324/750.3 |
| 6,286,118 | B1 | 9/2001 | Churchill et al. |
| 6,629,280 | B1 | 9/2003 | Koprowski et al. |
| 6,715,105 | B1 * | 3/2004 | Rearick ............................ 714/30 |
| 6,769,081 | B1 * | 7/2004 | Parulkar ........................ 714/733 |
| 6,978,411 | B2 * | 12/2005 | Huang et al. .................. 714/733 |
| 7,248,066 | B2 | 7/2007 | Saraswat et al. |
| 7,260,759 | B1 * | 8/2007 | Zarrineh et al. .............. 714/733 |
| 7,269,766 | B2 * | 9/2007 | Slobodnik et al. ............ 714/718 |
| 7,716,546 | B2 | 5/2010 | Le et al. |
| 7,831,877 | B2 | 11/2010 | Sul et al. |
| 7,844,867 | B1 * | 11/2010 | Reddy et al. .................. 714/718 |
| 8,091,002 | B2 | 1/2012 | Wang et al. |
| 2002/0194545 | A1 * | 12/2002 | Abbott ............................ 714/42 |
| 2003/0074621 | A1 * | 4/2003 | Dorsey .......................... 714/733 |
| 2006/0190789 | A1 * | 8/2006 | Kebichi et al. ................ 714/733 |

(Continued)

*Primary Examiner* — Albert Decady
*Assistant Examiner* — Kyle Vallecillo
(74) *Attorney, Agent, or Firm* — Gibb & Riley, LLC; David A. Cain, Esq.

(57) ABSTRACT

Each register in each built-in self-test (BIST) controller contains a BIST controller-specific start count value that is different from at least one other BIST controller-specific start count. A test controller provides a start command simultaneously to all the BIST controllers. This causes each of the BIST controllers to simultaneously begin a countdown of the BIST controller-specific start count values, using a counter. Each of the BIST controllers starts a test procedure in a corresponding BIST domain when the countdown completes (in the corresponding BIST controller). Thus, the test procedure starts at different times in at least two of the BIST domains based on the difference of the BIST controller-specific start count values in the different registers. Further, during the test procedure, each stagger controller can stagger the start of each BIST engine within the corresponding BIST domain to which the stagger controller is connected.

24 Claims, 9 Drawing Sheets

(56) References Cited

U.S. PATENT DOCUMENTS

| | | | |
|---|---|---|---|
| 2008/0016421 A1* | 1/2008 | McDevitt | 714/733 |
| 2008/0178053 A1* | 7/2008 | Gorman et al. | 714/718 |
| 2008/0222464 A1* | 9/2008 | Gorman et al. | 714/718 |
| 2009/0063921 A1 | 3/2009 | Aipperspach et al. | |
| 2011/0029827 A1* | 2/2011 | Chickanosky et al. | 714/718 |
| 2012/0191400 A1* | 7/2012 | Sontakke et al. | 702/119 |
| 2014/0053003 A1* | 2/2014 | Moyer et al. | 713/300 |

* cited by examiner

STAGGERED START OF BIST CONTROLLERS AND BIST ENGINES

BACKGROUND

The present disclosure relates to built-in self-test (BIST) devices and methods, and more specifically, to structures and methods that stagger the start of BIST controllers and that stagger the start of groups of BIST engines controlled by the BIST controllers.

Silicon chips are being populated with increasing amounts of memory and logic as technologies progress. Power demand due to simultaneous use of these memories can cause disturbances to the power supply. These voltage disturbances can cause memories or logic to fail due to operation outside of the rated voltage range.

As more memories are integrated onto chips and the power density of those chips increases (increasing watts per square mm) the risk that simultaneous access of memories will cause logic or memory failures increases greatly. Typical chip function will operate a subset of memory content at any one point in time in order to manage power consumption. Power supply decoupling capacitance can be added to chip and board designs to mitigate transient voltage disturbances and larger power supplies and/or improved cooling mechanisms can be applied to support higher power usage in general, but all of these solutions are expensive in terms of chip area and system cost.

Memory BIST (built-in self test) is designed to operate as many memories simultaneously as possible while still avoiding false failures due to over test (due to exceeding the power specification for a certain chip design). For a given chip design this might be a small subset, whereas for other chip designs this could include virtually all memories. In addition, memory BIST should be able to test with some margin compared to the normal functional application in order to produce good SPQL (shipped product quality level) while minimizing impacts to yield.

SUMMARY

This disclosure describes how the execution of each BIST domain and/or each BIST within a BIST domain can be cascaded in order to reduce the instantaneous demand on the power supply. This system is able to test with margin to the final chip functional application while still performing memory test in as parallel a fashion as possible in order to reduce test time (i.e., test cost).

One exemplary integrated circuit structure herein comprises a test controller and BIST controllers operatively (meaning directly or indirectly) connected to the test controller. Further, BIST engines are operatively connected to the BIST controllers. The BIST engines are grouped into BIST domains, and each BIST controller is connected to a single BIST domain.

Each BIST controller includes at least a register and a counter operatively connected to each other. Each register in each BIST controller contains a BIST controller-specific start count value. At least two of the BIST controllers contain different BIST controller-specific start count values in their register.

The test controller provides a start command simultaneously to all the BIST controllers. This causes each of the BIST controllers to simultaneously begin a countdown of the BIST controller-specific start count values, using the counter, when the BIST controllers receive the start command from the test controller. Each of the BIST controllers starts a test procedure in a corresponding BIST domain when the countdown completes (in the corresponding BIST controller). Thus, the test procedure starts at different times in at least two of the BIST domains based on the difference of the BIST controller-specific start count values in the different registers.

Another exemplary integrated circuit structure comprises a test controller and BIST controllers operatively connected to the test controller. Further, BIST engines are operatively connected to the BIST controllers. The BIST engines are grouped into BIST domains, and each BIST controller is connected to a single BIST domain.

Each BIST controller includes a register, a counter, and a stagger controller operatively connected to each other. The stagger controller is also operatively connected to the BIST domain. Each register in each BIST controller contains a BIST controller-specific start count value. At least two of the BIST controllers contain different BIST controller-specific start count values in their register. The BIST controller-specific start count value comprises a value other than zero. The counter comprises a decrement counter, and the countdown counts from the BIST controller-specific start count value to zero.

The test controller provides a start command simultaneously to all the BIST controllers. This causes each of the BIST controllers to simultaneously begin the countdown of the BIST controller-specific start count values, using the counter, when the BIST controllers receive the start command from the test controller. Each of the BIST controllers starts a test procedure in a corresponding BIST domain when the countdown completes (in the corresponding BIST controller). Thus, the test procedure initiated by a single test controller starts at different times in at least two of the BIST domains based on the difference of the BIST controller-specific start count values in the different registers. Further, during the test procedure, each stagger controller can stagger the start of each BIST engine within the corresponding BIST domain to which the stagger controller is operatively connected.

In additional embodiments, the test controller provides a delay enable command to the BIST controllers. In these embodiments, the BIST controllers delay the start of the test procedure (based on the BIST controller-specific start count values) only when the delay enable command is provided by the test controller.

The BIST controller-specific start count value can comprise a permanent value that cannot be changed, or the test controller can provide a count value change command that changes the BIST controller-specific start count value in the register of at least one of the BIST controllers.

A method (and non-transitory (tangible) storage device maintaining instructions) embodiment herein tests integrated circuit structures by providing a start command simultaneously from a test controller to the BIST controllers. The BIST controllers are operatively connected to BIST engines that are grouped into BIST domains, and each BIST controller is connected to a single BIST domain. As shown above, each BIST controller includes a register and a counter. Each register in each BIST controller contains a BIST controller-specific start count value. At least two of the BIST controllers contain different BIST controller-specific start count values in their register.

This exemplary method simultaneously begins a countdown of the BIST controller-specific start count value maintained in each register, using the counter, based on the BIST controllers receiving the start command from the test controller. Then, this method starts a test procedure in the corresponding BIST domain when the countdown completes within the corresponding BIST controller. The test procedure thus starts at different times in at least two of the BIST domains based on the difference of the BIST controller-specific start count values.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
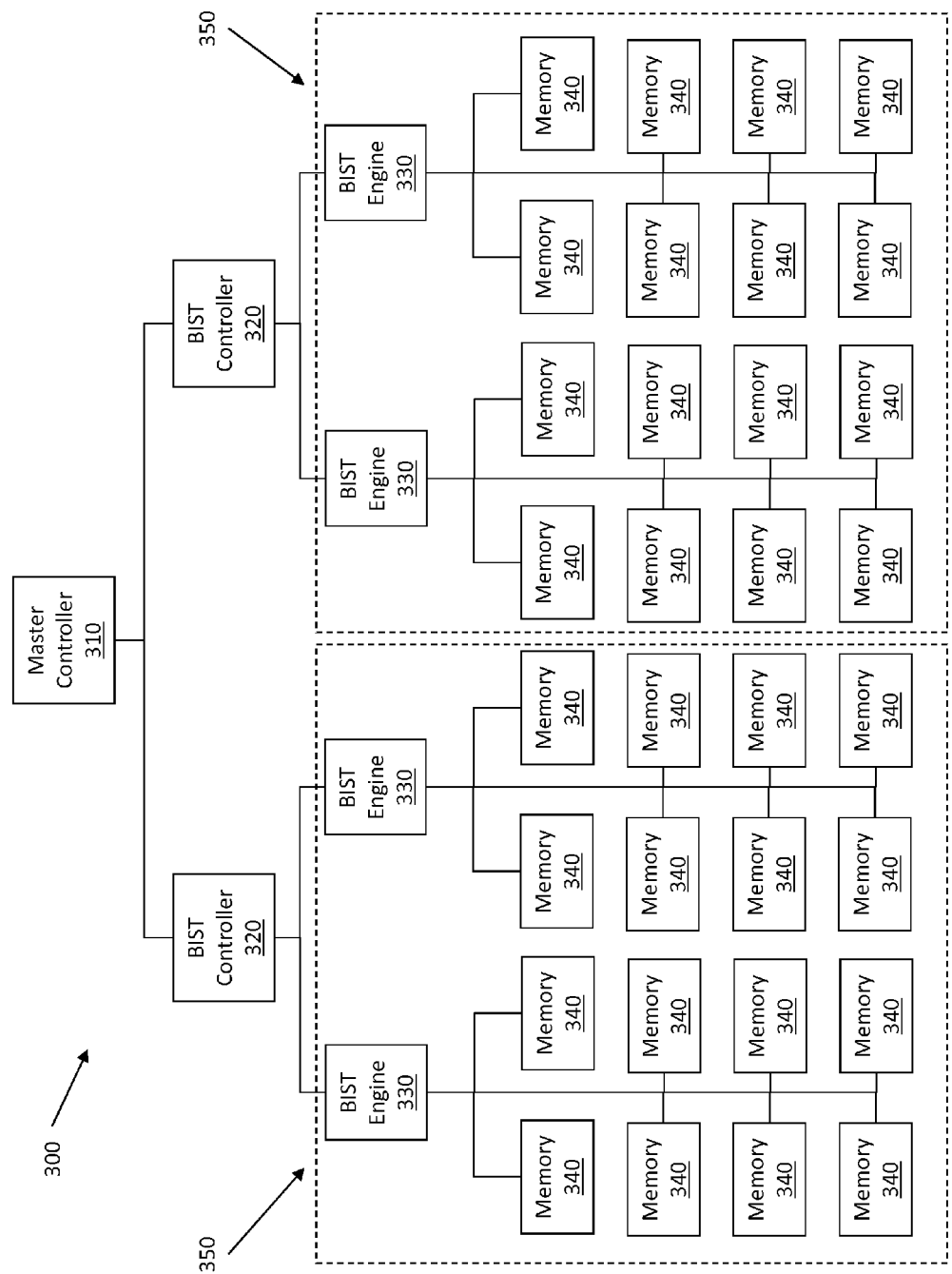
FIG. 1 is a schematic diagram illustrating embodiments herein.

The following is a brief description of possible chip test configurations for a given architecture. This shows how this arrangement can be controlled in order to mitigate noise associated with simultaneous BIST execution.

A BIST domain uses a single BIST controller and its associated BIST engines. There can be, for example, 1024 BIST controllers or BIST domains on a single chip. Each BIST controller can be shared by, for example, 4094 BIST engines, each of which may test, for example, 16 memories in parallel. Given this arrangement with its associated limits, there can be a very large number of memories that are simultaneously tested, demonstrating the importance of the ability to stagger or cascade the execution start time of a given BIST domain or BIST engines within a domain.

While each BIST controller can have an individual execution start mechanism, during manufacturing test all BIST controllers are executed from a single access point. Thus, if the execution start of each BIST controller and/or BIST engine is not cascaded during manufacturing testing, all BIST controllers and their associated BIST engines would begin execution at the same instant in time, creating undesirable noise associated with such an instantaneous demand on the power supply.

The structures and methods herein stagger BIST execution in order to reduce noise associated with the instantaneous demand on the power supply. In one exemplary embodiment, each execution start of each BIST domain can be cascaded or staggered by an independently programmed number of clock cycles. In another exemplary embodiment, the execution start for each BIST engine in a BIST domain can be cascaded or staggered by a programmed number of cycles.

Thus, in one example, the start of each BIST domain can be cascaded or staggered by an independently programmed number of clock cycles. Staggering the execution start independently for each BIST controller or BIST domain is possible by programming a stagger counter during manufacturing test. Each BIST controller's counter can be programmed independently in order to delay some BIST controllers more than others such that some can be started at different times. This allows the execution start to be cascaded in any desired fashion.

After the counter is programmed during a BIST controller write instruction, a BIST controller execution instruction can be loaded to ready the BIST controller to run BIST. When the execution instruction signal is pulsed, the counter decrements until it reaches zero, where the execution instruction signal is then propagated to all BIST engines within the BIST domain. All BIST engines within the domain would start their execution together.

In addition to (or as an alternative to) staggering start execution of BIST controllers, the execution start for BIST engines in a BIST domain can be cascaded or staggered by a programmed number of cycles. Staggering the execution start of each BIST engine within a given BIST domain is a feature that can be used during manufacturing test as well as in the system test.

During manufacturing test operation, staggering the execution start of each BIST engine within a BIST domain is accomplished by programming a stagger program register through a BIST controller write instruction. This register can be programmed independently within each BIST domain to allow the execution start of each BIST engine to be staggered at a different rate across domains. Once the register is programmed, then a run instruction can be loaded in order to ready the BIST controller to start its execution. The run instruction can include, for example, an execute stagger enable bit in the opcode to allow staggering to occur. If this bit is not enabled, then all BIST controllers and BIST engines within a domain begin their execution start in parallel. This allows the convenience of running in both parallel mode or stagger start mode easily without reprogramming the stagger program register.

Staggered execution start of each BIST engine begins when the execution instruction pulse is received by the BIST controller. If the execute stagger enable is loaded in the run instruction, then the counter decrements until it reaches zero, whereas the stagger program register is then loaded into this counter. It should be noted that the counter can initially be programmed to a zero value (no delayed BIST controller start) or non-zero value (delayed BIST controller start). Once the stagger program register is loaded into the counter, the counter decrements until it reaches zero.

In one specific example, a single walking-one (a one followed by zeros) can be sent out of a daisy chain of the BIST controller for capture into the first BIST engine within a stagger-mode walking-one latch. When the first BIST engine captures this walking-one via a single-cycle shift signal from the BIST controller, then execution starts for that first BIST engine. Each time the single-cycle shift signal is pulsed to enable the capture of the single walking-one, the counter is re-loaded with the value in the stagger program register, unless the walking-one has been received by the BIST controller (indicating that all BIST engines within that BIST domain are now executing and shifting of the walking-one is no longer needed). The embodiments herein are not limited to this specific example, and those ordinarily skilled in the art would understand that many methods could be used to stagger the start of testing of the BIST engines, so that not all of the BIST engines begin testing simultaneously.

During in-system operation, the staggering of the execution start of each BIST within a BIST domain can be slightly different because during in-system operation testing, each BIST controller has an independent start command that can be issued independently or concurrently to start the BIST controllers at different times or together respectively. Here the counter may is used after it is loaded with the stagger program register, since delaying the execution start of the BIST domain may not always be needed if multiple start commands can be issued (therefore the counter can begin with a zero value initially).

During in-system operation, when enabled with an enable signal (such as SYS_STAGGER_EN) the stagger program register can be loaded with the values driven on the counter bus to represent the number of cycles needed between BIST engine execution start times. When SYS_STAGGER_EN is set to one, the counter bus signal then allows the stagger-mode operation to occur once the execution instruction pulse is received by the BIST controller (or else parallel execution start will occur). The operation after the execution instruction signal is received is the same as that listed above for manufacturing test.

As mentioned above, there are two independent operations that can occur at the tester that can be used independently or together. Thus, the BIST domain execution start time staggering and the staggering of start times of BIST engines within a domain can be used separately or together.

Consistent with the discussion above, FIG. 1 illustrates an exemplary integrated circuit structure 300 that includes a master test controller 310 and BIST controllers 320 operatively connected to the test controller 310. Further, the BIST controllers 320 are operatively connected to the BIST engines 330, which in turn are operatively connected to memory elements or memory arrays (memory items 340). The BIST engines 330 are grouped into BIST domains that are represented by dashed lines 350. Each memory item 340 is connected (in parallel) to a single BIST engine 330, and each BIST engine 330 is connected (in parallel) to a single BIST controller 320. Therefore, each BIST domain 350 includes multiple BIST engines 330 and multiple memory elements 340, and each BIST controller 320 is connected to a single BIST domain 350.

Figure 2:
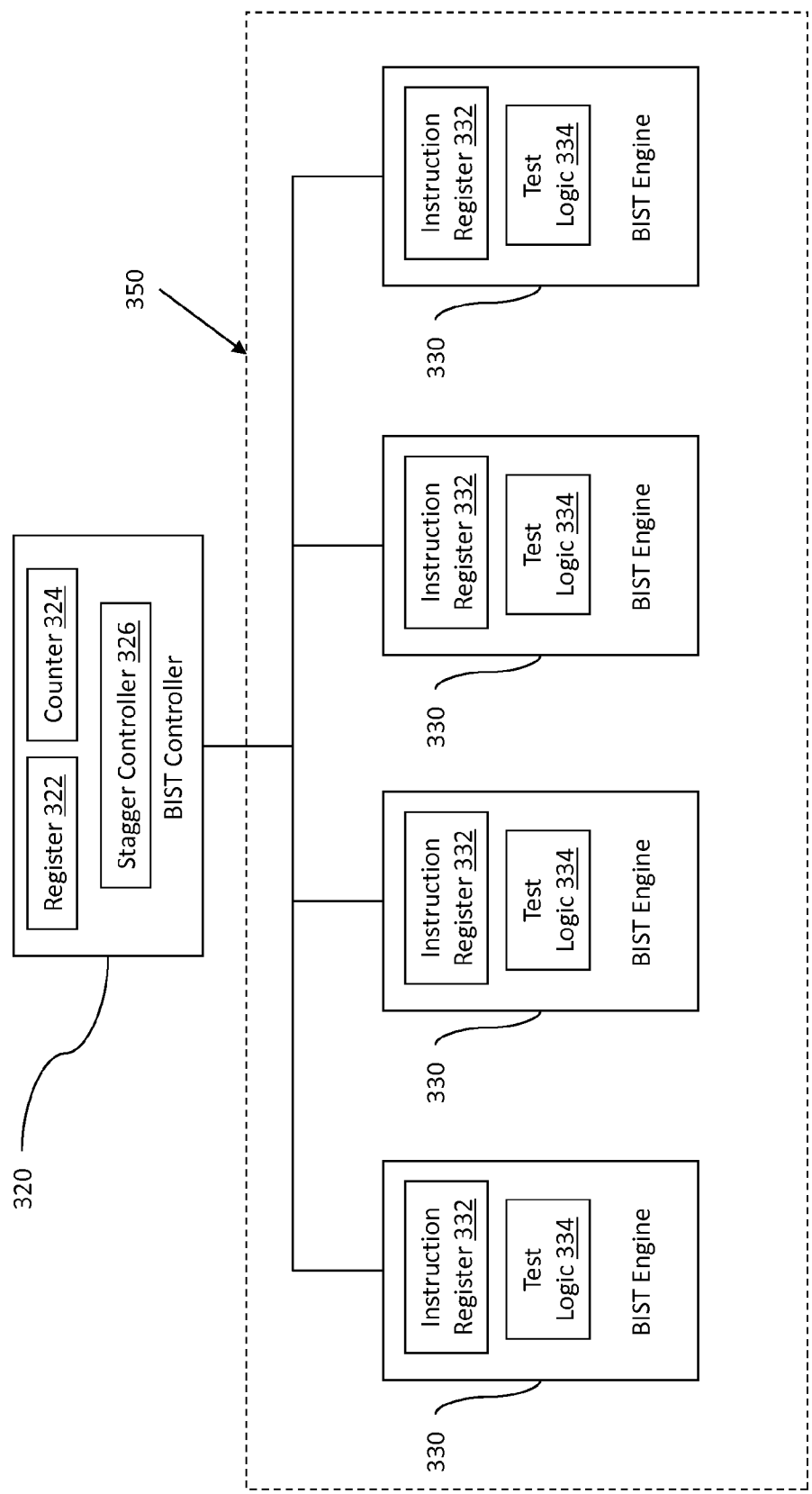
FIG. 2 is a schematic diagram illustrating embodiments herein.

FIG. 2 illustrates a single BIST domain 350 (made up of multiple BIST engines 330) connected to a BIST controller. Note that the memory items 340 are omitted from FIG. 2 to reduce clutter in the drawings. As shown in FIG. 2, each BIST controller 320 includes a register 322 and a counter 324 (as well as many other items not illustrated to reduce drawing clutter, as would be understood by those ordinarily skilled in the art) all of which can be operatively connected to each other.

Each register 322 in each BIST controller 320 contains a BIST controller-specific start count value, which can be different from one another to cause the BIST controllers 320 to start at different times. Thus, at least two of the BIST controllers 320 contain different BIST controller-specific start count values in their registers 322. If more than one of the BIST controller-specific start count values is the same, the BIST controllers 320 that receive that value will start testing at the same time. Therefore, each BIST controller 320 can be started at its own unique time, groups of BIST controllers 320 can be started simultaneously, or all BIST controllers 320 can be started simultaneously, depending upon the BIST controller-specific start count values supplied to the registers 322.

The BIST controller-specific start count value can comprise a value other than zero. The counter 324 can comprise, for example, a decrement counter, and thus the countdown process counts from the BIST controller-specific start count value to zero. The counter 324 can operate under any counting mechanism, such as incrementing one integer count during each clock cycle (when a clock pulse (local or global) is received). Further, the BIST controller-specific start count value can comprise a permanent value that cannot be changed, or the test controller 310 (or other controller) can provide a count value change command that changes the BIST controller-specific start count value in the register of at least one of the BIST controllers 320.

In one example of manufacturing test operation, the single test controller 310 provides a start command simultaneously to all the BIST controllers 320. This causes each of the BIST controllers 320 to simultaneously begin a countdown of their own BIST controller-specific start count value, using their counter 324. Each of the BIST controllers 320 starts a test procedure in a corresponding BIST domain 350 (either simultaneously or staggered) when their own individual countdown completes. Thus, the test procedure initiated by a single test controller 310 starts at different times in at least two of the BIST domains 350 based on the difference of the BIST controller-specific start count values in the different registers 322.

In additional embodiments, the test controller 310 can provide a delay enable command to the BIST controllers 320 to control whether the counters 324 will be used (and whether the staggering process will occur). In this embodiment, the BIST controllers 320 delay the start of the test procedure (based on the BIST controller-specific start count values) only when the delay enable command is provided by the test controller 310. Otherwise, if the delay enable command is not provided by the test controller 310, all BIST controllers 320 begin testing simultaneously.

Further, each BIST controller 320 can include an item that is generically referred to herein as a "stagger controller" 326. The stagger controller 326 controls the starting of the BIST engines 330 (using, for example the daisy chain and walking-one example discussed above (and possibly other structures and methods)) and is therefore also operatively connected to the BIST domain 350. Therefore, the stagger controller 326 can be any structure that controls the order, timing, etc., of when and how many of the BIST engines 330 start testing procedures (simultaneously, sequentially, partially sequentially, etc.).

Thus, as discussed above, during the test procedure, each stagger controller 326 can stagger the start of each BIST engine 330 within the corresponding BIST domain 350 to which the stagger controller 326 is operatively connected. Note that the stagger controller 326 can be used when the delay enable function for staggering the BIST controllers 320 is used or not (and the BIST engine staggering function can be used during manufacturing test operation and during in-system operation).

Figure 3:
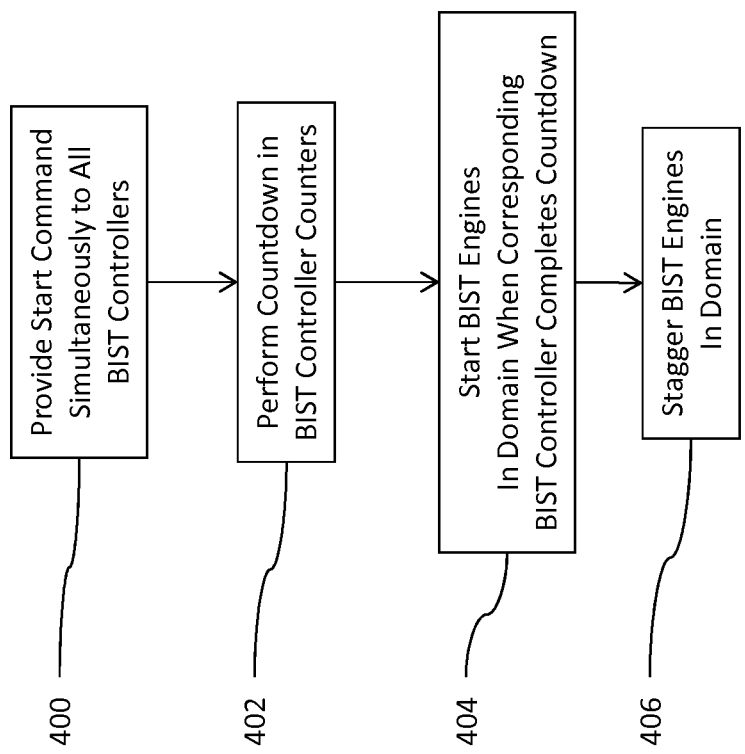
FIG. 3 is a flow diagram illustrating embodiments herein.

FIG. 3 is a flowchart that illustrates method (and non-transitory storage device maintaining method instruction) embodiments herein used to test integrated circuit structures. In item 400, this flow starts by providing a start command simultaneously from a test controller to the BIST controllers. As shown above, the BIST controllers are operatively connected to BIST engines that are grouped into BIST domains, and each BIST controller is connected to a single BIST domain. As also shown above, each BIST controller includes a register and a counter. Each register in each BIST controller contains a potentially unique BIST controller-specific start count value. Again, at least two of the BIST controllers contain different BIST controller-specific start count values in their register.

This exemplary method thus simultaneously begins a countdown of the BIST controller-specific start count value maintained in each register, using the counter, in item 402 based on the BIST controllers receiving the start command from the test controller. Then, this method starts a test procedure in a corresponding one of the BIST domains when the countdown completes in a corresponding one of the BIST controllers in item 404. The test procedure thus starts at different times in at least two of the BIST domains based on the difference of the BIST controller-specific start count values. Further, without respect to whether BIST controllers are started simultaneously or sequentially, in item 406, the BIST engines within a domain can also be staggered, depending upon an instruction to stagger the BIST engines (from any source including the master controller, the BIST controller, etc.).

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
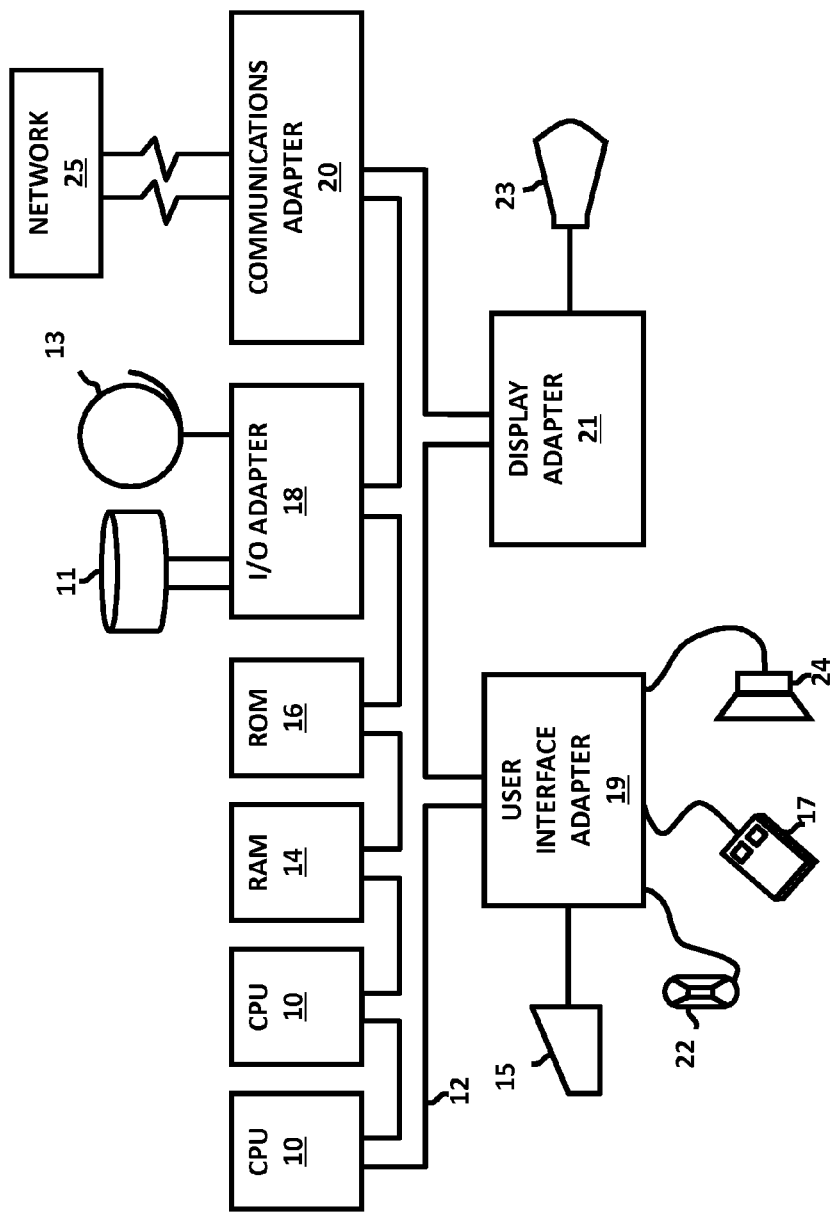
FIG. 4 is a schematic diagram of a hardware system according to embodiments herein.

A representative hardware environment for practicing the embodiments herein is depicted in FIG. 4. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

Deployment types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, and then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 5:
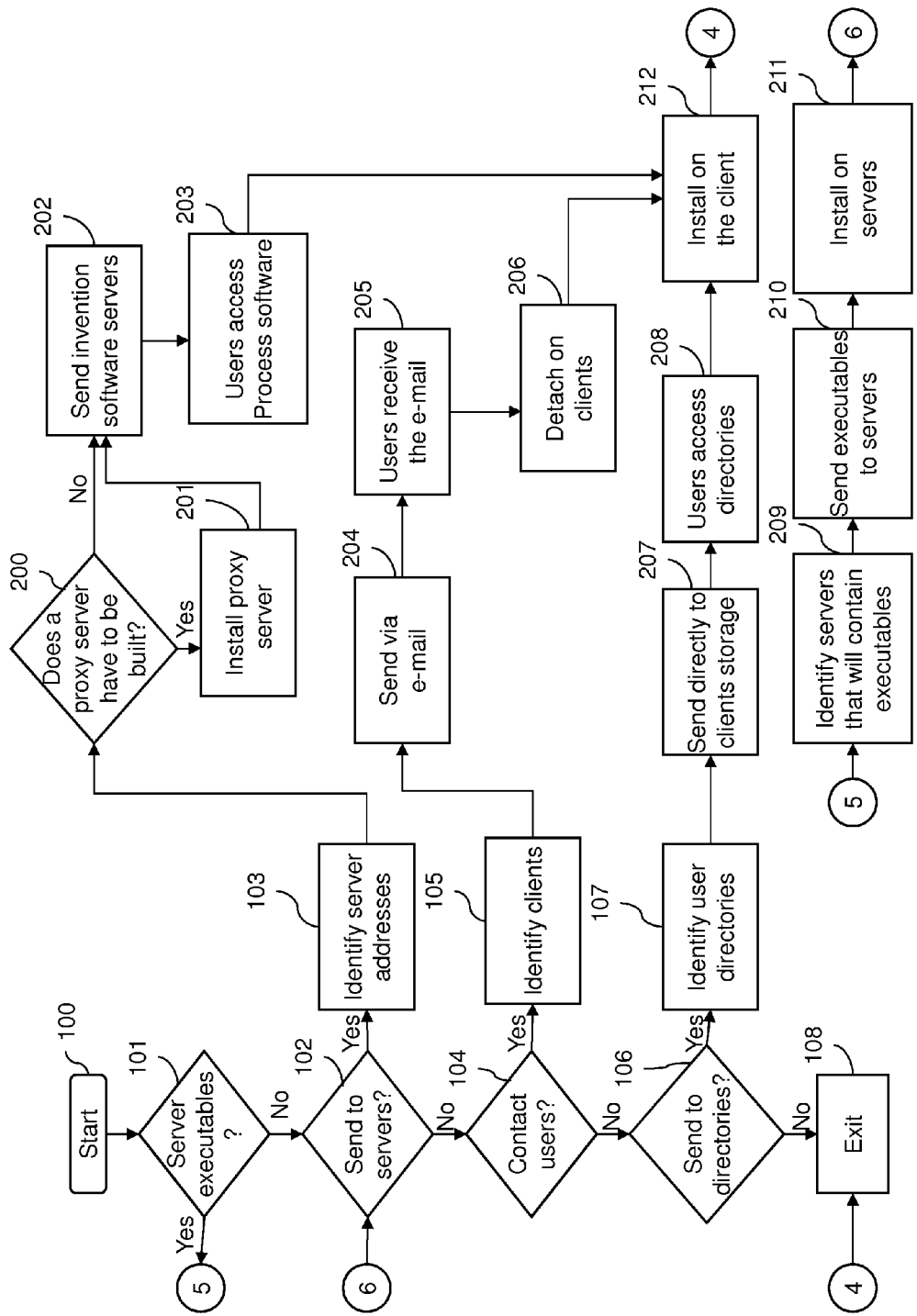
FIG. 5 is a schematic diagram of a deployment system according to embodiments herein.

In FIG. 5, Step 100 begins the deployment of the process software. The first thing is to determine if there are any programs that will reside on a server or servers when the process software is executed 101. If this is the case then the servers that will contain the executables are identified 209. The process software for the server or servers is transferred directly to the servers' storage via FTP or some other protocol or by copying through the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail 204 to each of the users' client computers. The users then receive the e-mail 205 and then detach the process software from the e-mail to a directory on their client computers 206. The user executes the program that installs the process software on his client computer 212 then exits the process 108.

Lastly, a determination is made on whether to the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6:
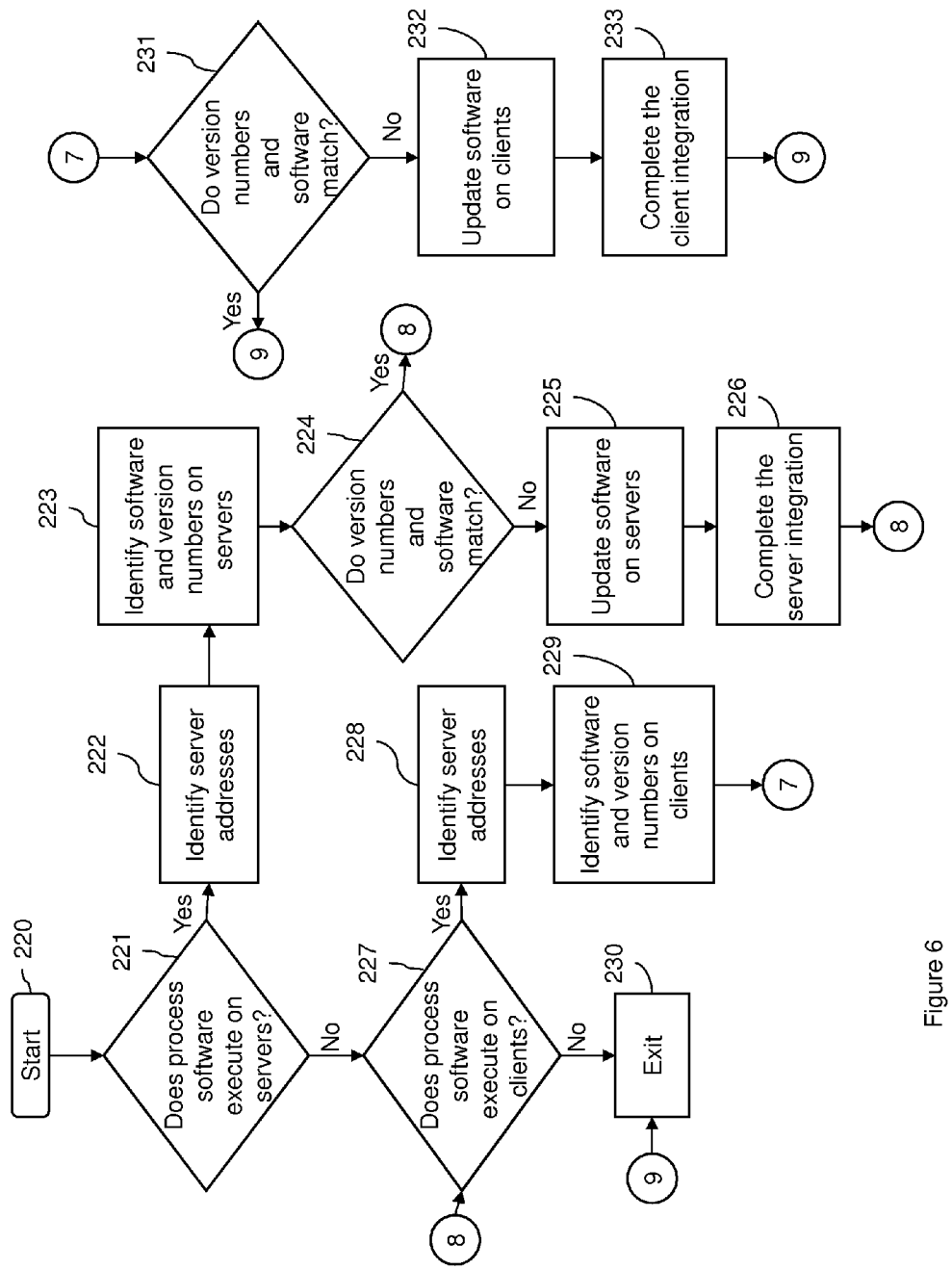
FIG. 6 is a schematic diagram of an integration system according to embodiments herein.

In FIG. 6, Step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally if there is missing required software, then it is updated on the server or servers 225. The server integration is completed by installing the process software 226.

Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a payas-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 7:
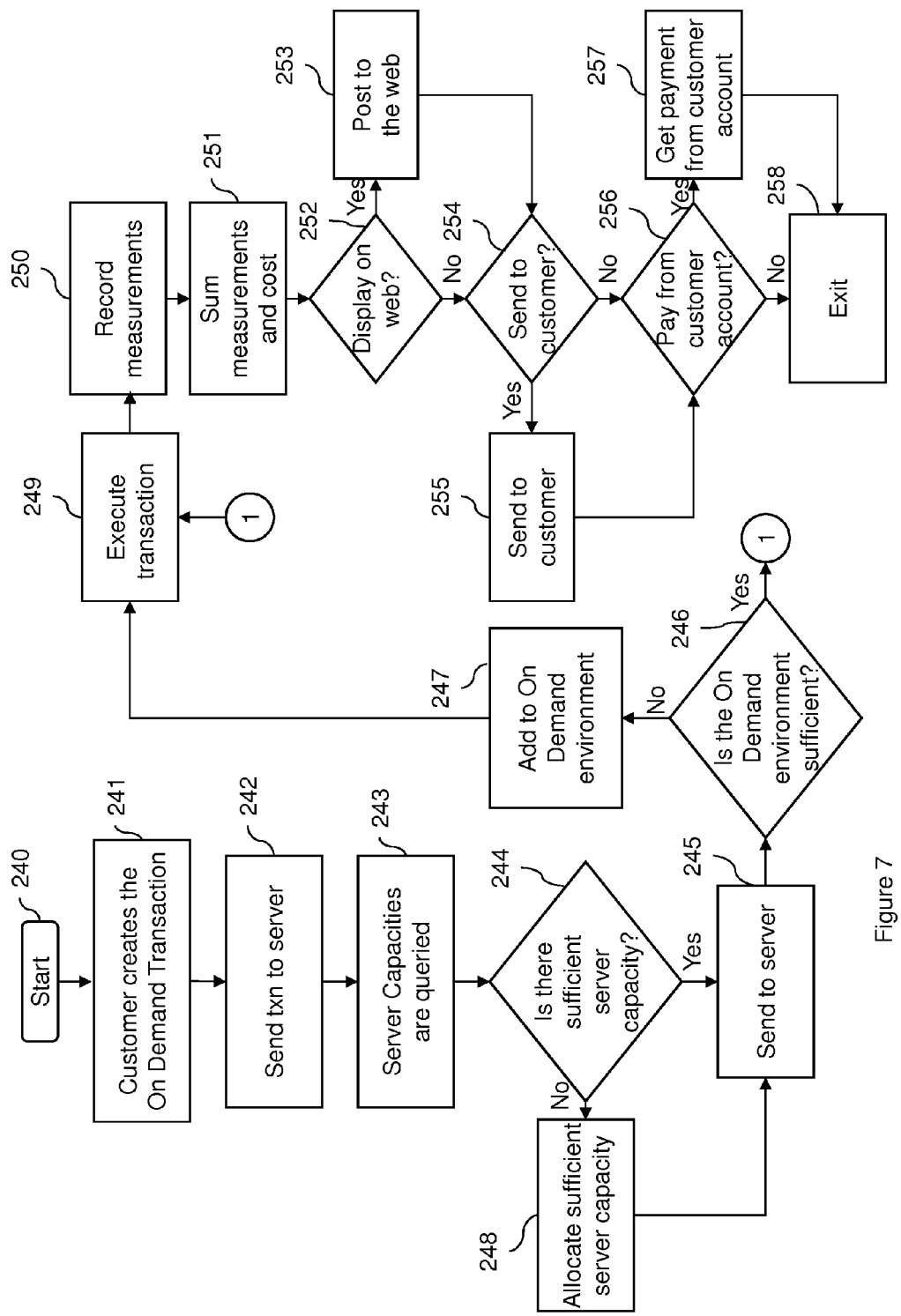
FIG. 7 is a schematic diagram of an on demand system according to embodiments herein.

In FIG. 7, Step 240 begins the On Demand process. A transaction is created than contains the unique customer identification, the requested service type and any service parameters that further specify the type of service 241. The transaction is then sent to the main server 242. In an On Demand environment the main server can initially be the only server, and then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, and then the transaction is executed 249.

The usage measurements are recorded 250. The usage measurements consist of the portions of those functions in the On Demand environment that is used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is to exit the On Demand process 258.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling 273 which is the process of placing an entire packet within another packet and sending it over a network. The protocol of the outer packet is understood by the network and both points, called tunnel interfaces, where the packet enters and exits the network.

Figure 8:
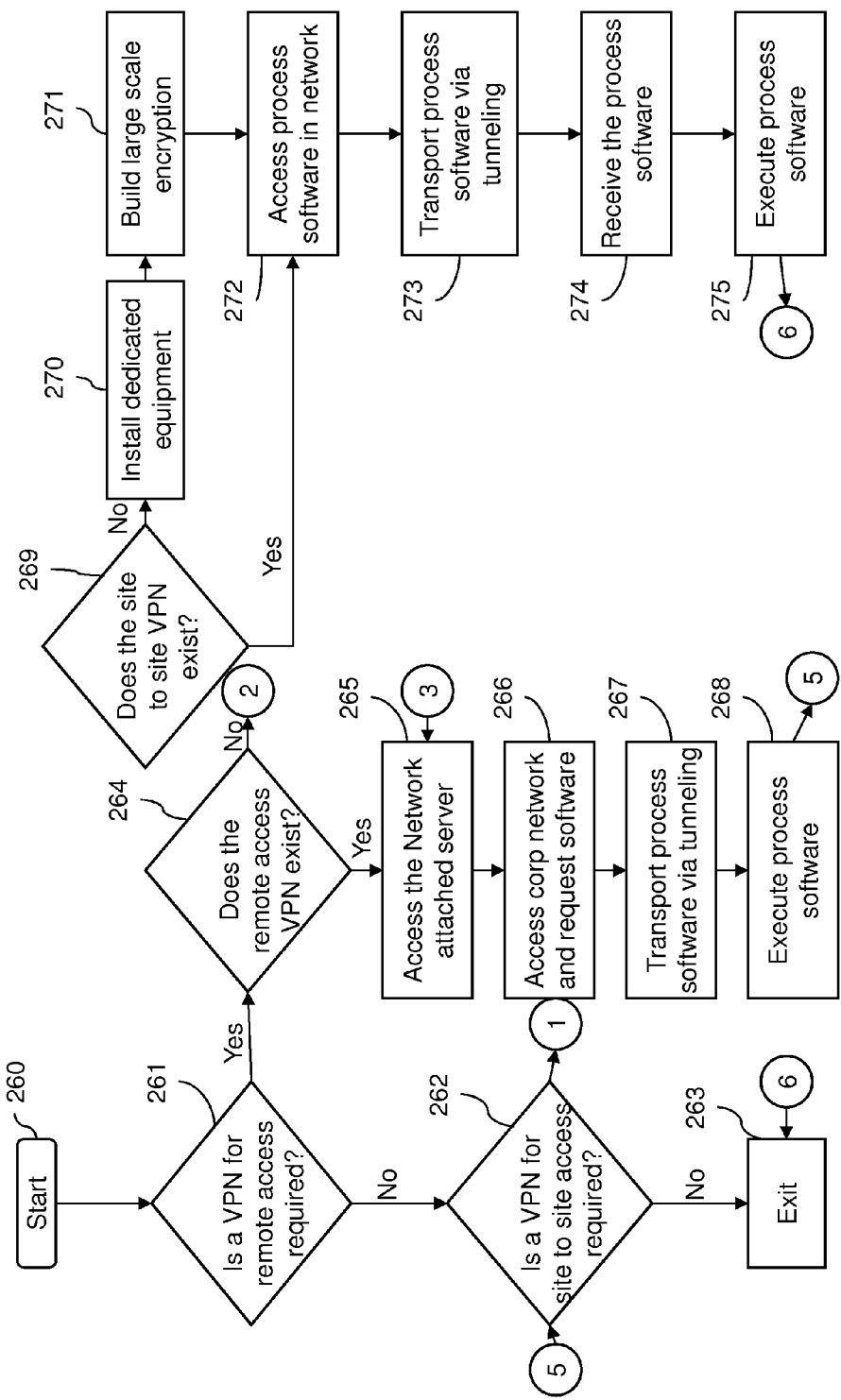
FIG. 8 is a schematic diagram of a virtual private network system according to embodiments herein.
Figure 9:
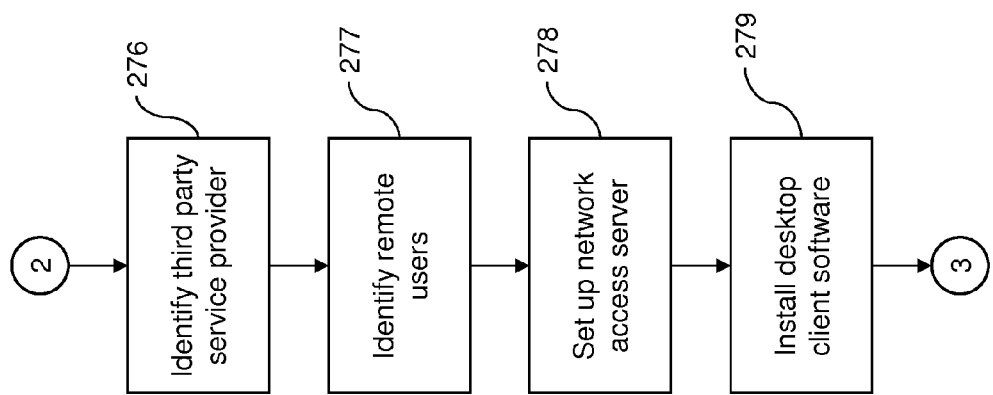
FIG. 9 is a schematic diagram of a virtual private network system according to embodiments herein.

In FIGS. 8 and 9, Step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is, the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is, the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
   a test controller;
   built-in self-test (BIST) controllers operatively connected to said test controller; and
   BIST engines operatively connected to said BIST controllers, said BIST engines being grouped into BIST domains, each BIST controller of said BIST controllers being connected to a single BIST domain of said BIST domains,
   each said BIST controller comprising:
      a register containing a BIST controller-specific start count value; and
      a counter operatively connected to said register,
   said BIST controllers comprising at least two BIST controllers connected to at least two BIST domains, respectively, and comprising corresponding registers containing different BIST controller-specific start count values,
   said test controller providing a start command simultaneously to all of said BIST controllers,
   said BIST controllers receiving said start command and, in response to said start command, simultaneously beginning countdowns,
   said countdowns being performed by said counter in each said BIST controller using said BIST controller-specific start count value contained in said register such that said countdowns differ in said at least two BIST controllers comprising said corresponding registers containing said different BIST controller-specific start count values, and
   each said BIST controller starting a test procedure in a corresponding BIST domain upon completion of a countdown by said BIST controller such that test procedures start at different times in said at least two BIST domains based on said different BIST controller-specific start count values.

2. The integrated circuit according to claim 1, said test controller providing a delay enable command to said BIST controllers, said BIST controllers beginning said countdowns and delaying start of said test procedures by said BIST controller-specific start count values only when said delay enable command is provided by said test controller.

3. The integrated circuit according to claim 1, said BIST controller-specific start count value comprising a value other than zero, said counter comprising a decrement counter, and said countdown counting from said BIST controller-specific start count value to zero.

4. The integrated circuit according to claim 1, said test controller comprising a single test controller.

5. The integrated circuit according to claim 1, said BIST controller-specific start count value comprising a permanent value that cannot be changed.

6. The integrated circuit according to claim 1, said test controller providing a count value change command changing said BIST controller-specific start count value in said register of at least one of said BIST controllers.

7. An integrated circuit structure comprising:
   a test controller;
   built-in self-test (BIST) controllers operatively connected to said test controller; and
   BIST engines operatively connected to said BIST controllers, said BIST engines being grouped into BIST domains, each BIST controller of said BIST controllers being connected to a single BIST domain of said BIST domains, each said BIST controller comprising:
- a register containing a BIST controller-specific start count value;
- a counter operatively connected to said register; and
- a stagger controller operatively connected to said BIST domain, said BIST controllers comprising at least two BIST controllers connected to at least two BIST domains, respectively, and comprising corresponding registers containing different BIST controller-specific start count values, said test controller providing a start command simultaneously to all of said BIST controllers, said BIST controllers receiving said start command and, in response to said start command, simultaneously beginning countdowns, said countdowns being performed by said counter in each said BIST controller using said BIST controller-specific start count value contained in said register such that said countdowns differ in said at least two BIST controllers comprising said corresponding registers containing said different BIST controller-specific count values, each said BIST controller starting a test procedure in a corresponding one of said BIST domains upon completion of a countdown by said BIST controller such that test procedures start at different times in said at least two BIST domains based on said different BIST controller-specific start count values, and during said test procedure, each said stagger controller staggering a start of each said BIST engine in said corresponding one of said BIST domains to which said stagger controller is operatively connected.

8. The integrated circuit according to claim 7, said test controller providing a delay enable command to said BIST controllers, said BIST controllers beginning said countdowns and delaying start of said test procedures by said BIST controller-specific start count values only when said delay enable command is provided by said test controller.

9. The integrated circuit according to claim 7, said BIST controller-specific start count value comprising a value other than zero, said counter comprising a decrement counter, and said countdown counting from said BIST controller-specific start count value to zero.

10. The integrated circuit according to claim 7, said test controller comprising a single test controller.

11. The integrated circuit according to claim 7, said BIST controller-specific start count value comprising a permanent value that cannot be changed.

12. The integrated circuit according to claim 7, said test controller providing a count value change command changing said BIST controller-specific start count value in said register of at least one of said BIST controllers.

13. A method of testing an integrated circuit structure comprising:
providing a start command simultaneously from a test controller to built-in self-test (BIST) controllers operatively connected to said test controller, said BIST controllers being operatively connected to BIST engines, said BIST engines being grouped into BIST domains, each BIST controller of said BIST controllers being connected to a single BIST domain of said BIST domains, and each said BIST controller comprising:
a register containing a BIST controller-specific start count value; and
a counter operatively connected to said register, said BIST controllers comprising at least two BIST controllers connected to at least two BIST domains, respectively, and comprising corresponding registers containing different BIST controller-specific start count values;

simultaneously beginning, by said BIST controllers, countdowns in response to said start command, said countdowns being performed by said counter in each said BIST controller using said BIST controller-specific start count value contained in said register such that said countdowns differ in said at least two BIST controllers comprising said corresponding registers containing said different BIST controller-specific start count values; and starting, by each said BIST controller, a test procedure in a corresponding BIST domain upon completion of a countdown by said BIST controller such that test procedures start at different times in said at least two BIST domains based on said different BIST controller-specific start count values.

14. The method according to claim 13, further comprising providing a delay enable command from said test controller to said BIST controllers, said BIST controllers beginning said countdowns and delaying start of said test procedures by said BIST controller-specific start count values only when said delay enable command is provided by said test controller.

15. The method according to claim 13, said BIST controller-specific start count value comprising a value other than zero, said counter comprising a decrement counter, and said countdown comprising counting from said BIST controller-specific start count value to zero.

16. The method according to claim 13, said test controller comprising a single test controller.

17. The method according to claim 13, said BIST controller-specific start count value comprising a permanent value that cannot be changed.

18. The method according to claim 13, further comprising providing, from said test controller, a count value change command changing said BIST controller-specific start count value in said register of at least one of said BIST controllers.

19. A non-transitory storage medium readable by computerized device, said tangible storage medium storing instructions executable by said computerized device to perform a method of testing an integrated circuit structure, said method comprising:
providing a start command simultaneously from a test controller to built-in self-test (BIST) controllers operatively connected to said test controller, said BIST controllers being operatively connected to BIST engines, said BIST engines being grouped into BIST domains, each BIST controller of said BIST controllers being connected to a single BIST domain of said BIST domains, and each said BIST controller comprising:
a register containing a BIST controller-specific start count value; and
a counter operatively connected to said register, said BIST controllers comprising at least two BIST controllers connected to at least two BIST domains, respectively, and comprising corresponding registers containing different BIST controller-specific start count values;

simultaneously beginning, by said BIST controllers, countdowns in response to said start command, said countdowns being performed by said counter in each said BIST controller using said BIST controller-specific start count value contained in said register such that said countdowns differ in said at least two BIST controllers comprising said corresponding registers containing said different BIST controller-specific start count values; and starting, by each said BIST controller, a test procedure in a corresponding BIST domains upon completion of a countdown by said BIST controller such that test procedures start at different times in said at least two BIST domains based on said different BIST controller-specific start count values.

20. The tangible storage medium according to claim 19, said method further comprising providing a delay enable command from said test controller to said BIST controllers, said BIST controllers beginning said countdowns and delaying start of said test procedure by said BIST controller-specific start count values only when said delay enable command is provided by said test controller.

21. The tangible storage medium according to claim 19, said BIST controller-specific start count value comprising a value other than zero, said counter comprising a decrement counter, and said countdown comprising counting from said BIST controller-specific start count value to zero.

22. The tangible storage medium according to claim 19, said test controller comprising a single test controller.

23. The tangible storage medium according to claim 19, said BIST controller-specific start count value comprising a permanent value that cannot be changed.

24. The tangible storage medium according to claim 19, said method further comprising providing, from said test controller, a count value change command changing said BIST controller-specific start count value in said register of at least one of said BIST controllers.

* * * * *